US009607987B2

(12) United States Patent
Giles et al.

(10) Patent No.: US 9,607,987 B2
(45) Date of Patent: Mar. 28, 2017

(54) METHODS FOR FORMING FINS FOR METAL OXIDE SEMICONDUCTOR DEVICE STRUCTURES

(75) Inventors: Martin D. Giles, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 539 days.

(21) Appl. No.: 13/996,468

(22) PCT Filed: Dec. 21, 2011

(86) PCT No.: PCT/US2011/066671
§ 371 (c)(1),
(2), (4) Date: Jun. 20, 2013

(87) PCT Pub. No.: WO2013/095474
PCT Pub. Date: Jun. 27, 2013

(65) Prior Publication Data
US 2014/0151814 A1   Jun. 5, 2014

(51) Int. Cl.
*H01L 27/092* (2006.01)
*H01L 21/8238* (2006.01)
*H01L 21/84* (2006.01)
*H01L 27/12* (2006.01)
*H01L 29/78* (2006.01)
(Continued)

(52) U.S. Cl.
CPC ...... *H01L 27/092* (2013.01); *H01L 21/02532* (2013.01); *H01L 21/823821* (2013.01); *H01L 21/845* (2013.01); *H01L 27/0924* (2013.01); *H01L 27/1211* (2013.01);
(Continued)

(58) Field of Classification Search
None
See application file for complete search history.

(56) References Cited

U.S. PATENT DOCUMENTS 7,705,345 B2 * 4/2010 Bedell ................ H01L 21/845
257/15
7,727,830 B2   6/2010 Jin et al.
(Continued)

FOREIGN PATENT DOCUMENTS

CN   1925119    3/2007
CN   101866885  10/2010
(Continued)

OTHER PUBLICATIONS

Krishnamohan, Tejas, et al., "High-Mobility Ultrathin Strained Ge MOSFETs on Bulk and SOI With Low Band-to-Band Tunneling Leakage: Experiments", *IEEE Transactions on Electron Devices*, vol. 53, No. 5, May 2006, pp. 990-999.
(Continued)

*Primary Examiner* — Bilkis Jahan
(74) *Attorney, Agent, or Firm* — Blakely, Sokoloff, Taylor & Zafman LLP

(57) ABSTRACT

Methods are disclosed for forming fins in transistors. In one embodiment, a method of fabricating a device includes forming silicon fins on a substrate and forming a dielectric layer on the substrate and adjacent to the silicon fins such that an upper region of each silicon fin is exposed. Germanium may then be epitaxially grown germanium on the upper regions of the silicon fins to form germanium fins.

17 Claims, 15 Drawing Sheets

(51) Int. Cl.
*H01L 29/165* (2006.01)
*H01L 21/02* (2006.01)
*H01L 29/423* (2006.01)
*H01L 29/66* (2006.01)

(52) U.S. Cl.
CPC ...... *H01L 29/165* (2013.01); *H01L 29/42392* (2013.01); *H01L 29/66795* (2013.01); *H01L 29/785* (2013.01)

(56) References Cited

U.S. PATENT DOCUMENTS

| | | | |
|---|---|---|---|
| 7,799,592 | B2 | 9/2010 | Lochtefeld |
| 7,915,167 | B2 | 3/2011 | Radosavljevic et al. |
| 8,017,463 | B2 | 9/2011 | Chang |
| 2004/0099903 | A1 | 5/2004 | Yeo et al. |
| 2005/0077553 | A1* | 4/2005 | Kim ............... H01L 21/82341 257/288 |
| 2005/0199919 | A1 | 9/2005 | Liu et al. |
| 2007/0238273 | A1* | 10/2007 | Doyle ............. H01L 21/26586 438/525 |
| 2008/0135890 | A1 | 6/2008 | Nakagawa et al. |
| 2009/0001415 | A1* | 1/2009 | Lindert ........... H01L 29/66795 257/190 |
| 2009/0152589 | A1 | 6/2009 | Rakshit et al. |
| 2009/0170251 | A1* | 7/2009 | Jin ..................... B82Y 10/00 438/197 |
| 2009/0315114 | A1 | 12/2009 | Rakshit et al. |
| 2010/0072515 | A1 | 3/2010 | Park et al. |
| 2010/0264468 | A1 | 10/2010 | Xu et al. |
| 2011/0024804 | A1* | 2/2011 | Chang ............... H01L 29/165 257/288 |
| 2011/0097889 | A1 | 4/2011 | Yuan et al. |
| 2011/0101421 | A1 | 5/2011 | Xu |
| 2011/0108920 | A1 | 5/2011 | Basker et al. |
| 2011/0147848 | A1 | 6/2011 | Kuhn et al. |
| 2011/0193141 | A1 | 8/2011 | Lin et al. |
| 2011/0227165 | A1 | 9/2011 | Basker et al. |

FOREIGN PATENT DOCUMENTS

| | | |
|---|---|---|
| TW | 201115626 | 5/2011 |
| TW | 201118933 | 6/2011 |

OTHER PUBLICATIONS

Krishnamohan, Tejas, et al., "Low Defect Ultra-thin Fully Strained-Ge MOSFET on Relaxed Si with Hight Mobility and Low Band-to-Band-Tunneling (BTBT)", *VLSI Technology*, 2005 Symposium on, Jun. 14-16, 2005, 2 pages.

Liu, Fangyue, et al., "A New Source/Drain Germanium-Enrichment Process Comprising Ge Deposition and Laser-Induced Local Melting and Recrystallization for P-FET Performance Enhancement", *VLSI Technology*, 2008 Symposium on, Jun. 17-19, 2008, 2 pages.

Wang, Feng, et al., "Highly Selective Chemical Etching of Si vs. $Si_{1-x}Ge_x$ Using $NH_4OH$ Solution", *J. Electrochem. Soc.*, vol. 144, No. 3, Mar. 1997.

International Search Report for PCT/US2011/066671 mailed Sep. 17, 2012, 4 pages.

Written Opinion of the International Searching Authority for PCT/US2011/066671 mailed Sep. 17, 2012, 5 pages.

International Preliminary Report on Patentability for PCT/US2011/066671 mailed Jun. 24, 2014, 6 pages.

\* cited by examiner

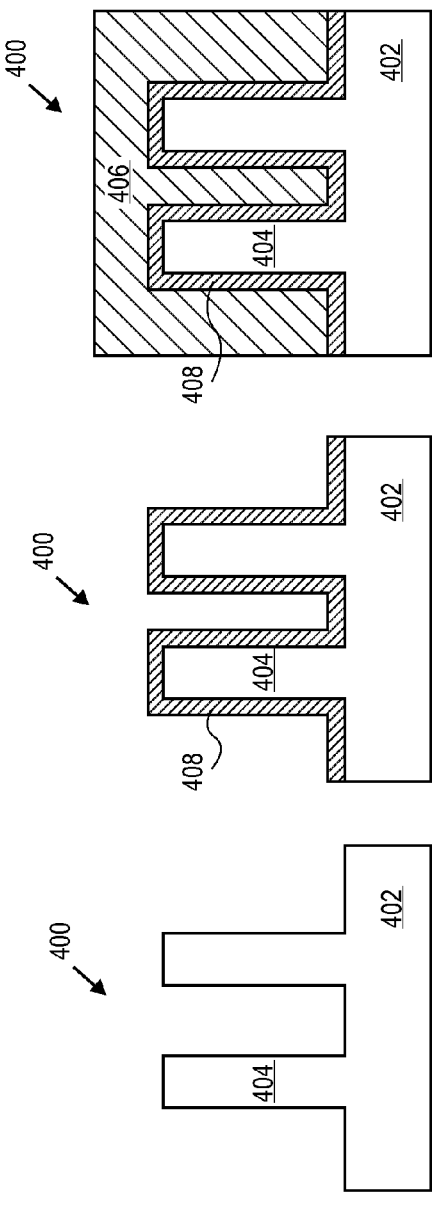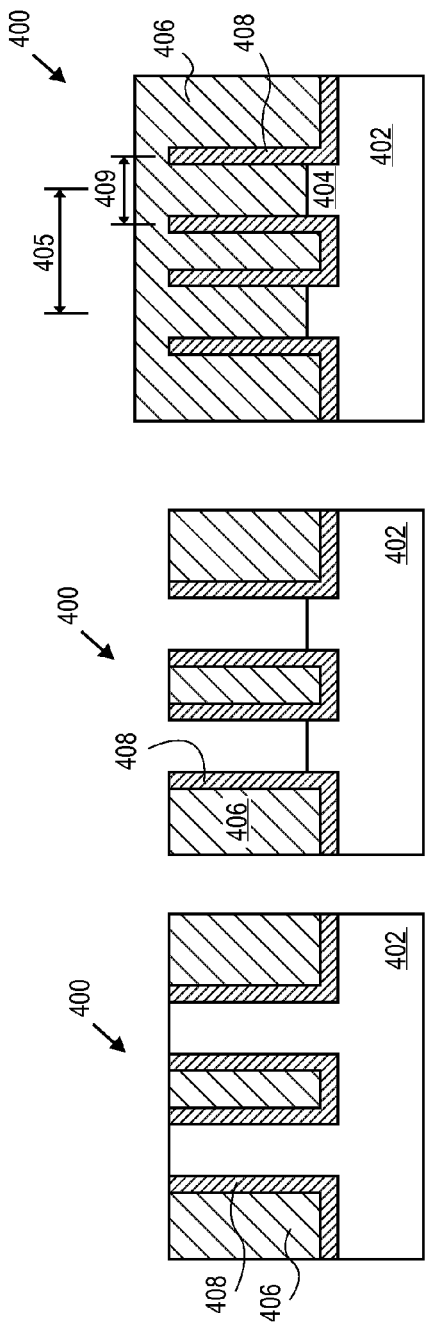
FIG. 4A, FIG. 4B, FIG. 4C, FIG. 4D, FIG. 4E, FIG. 4F

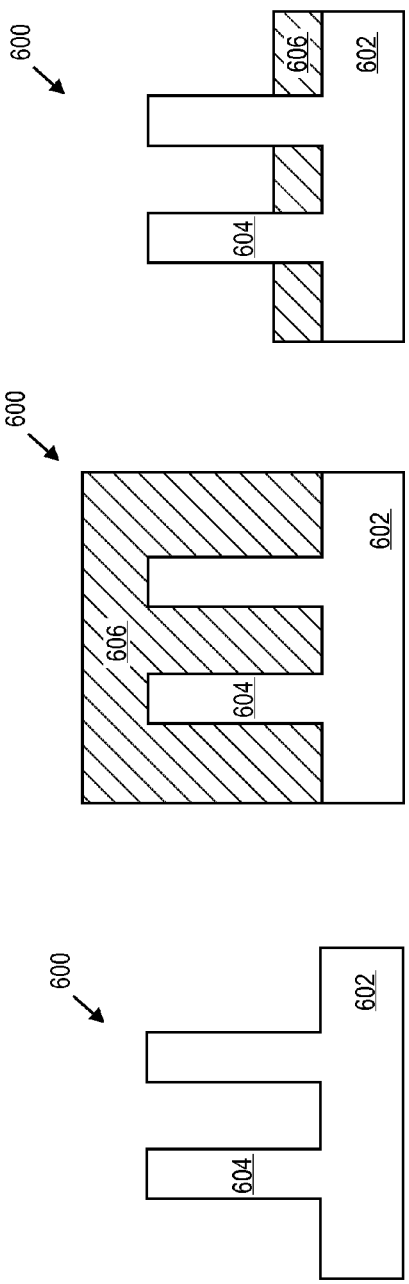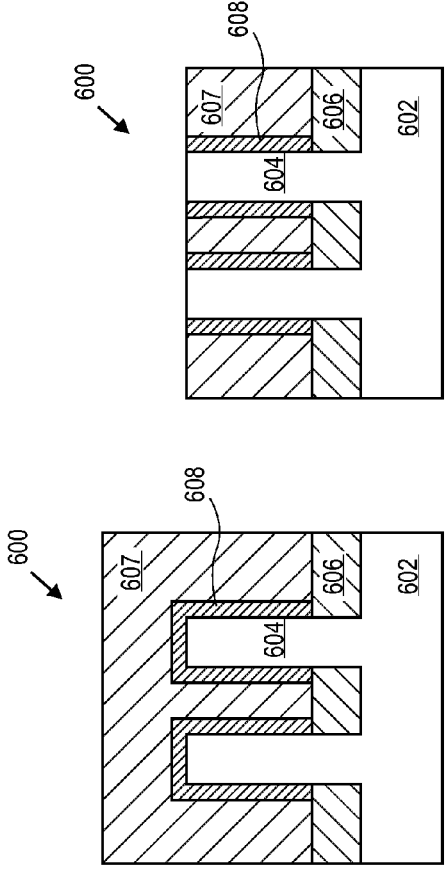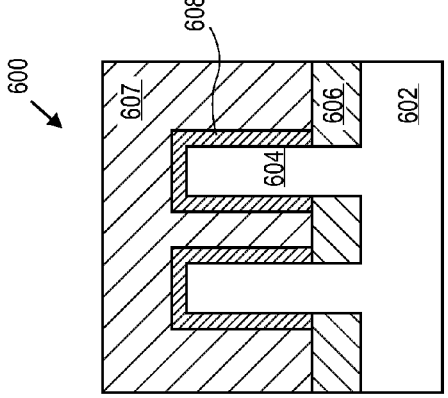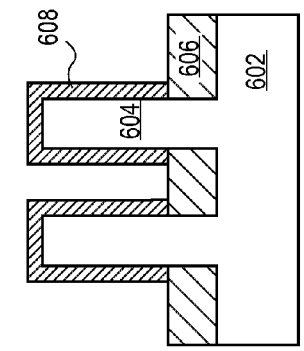
FIG. 6A  FIG. 6B  FIG. 6C  FIG. 6D  FIG. 6E  FIG. 6F

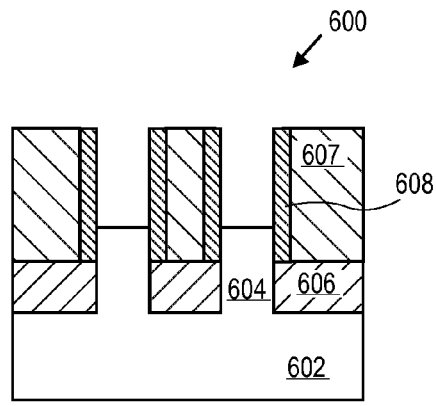 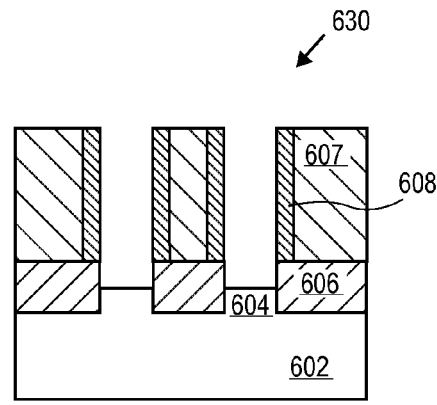
FIG. 6G  FIG. 6G'
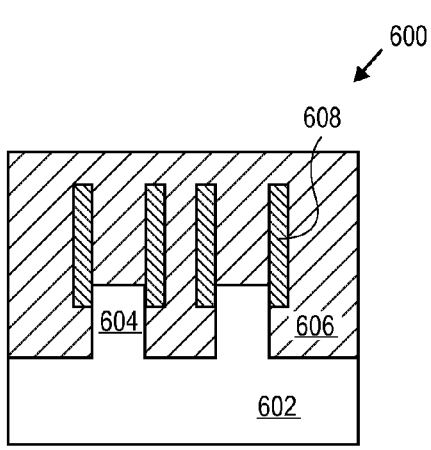 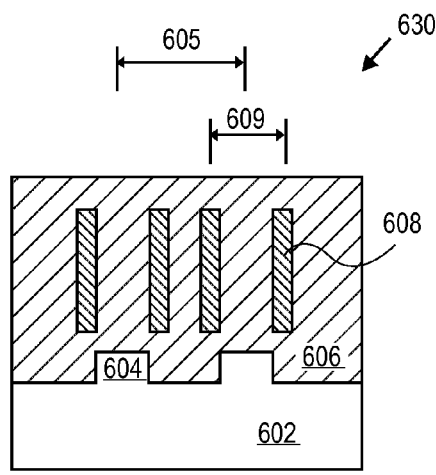
FIG. 6H  FIG. 6I
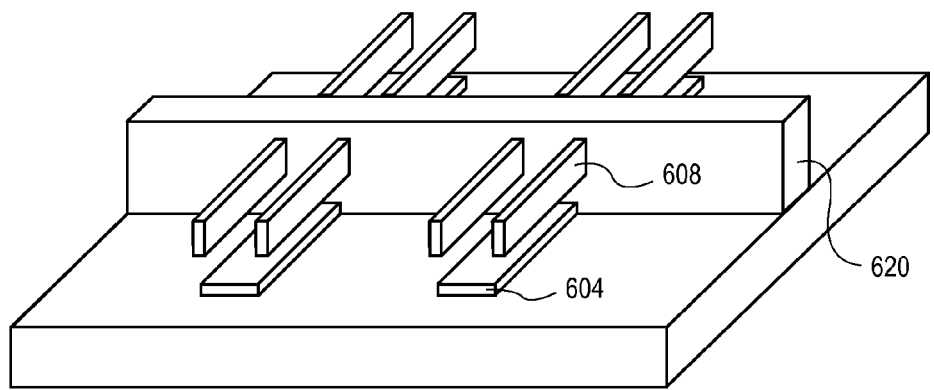
FIG. 6J

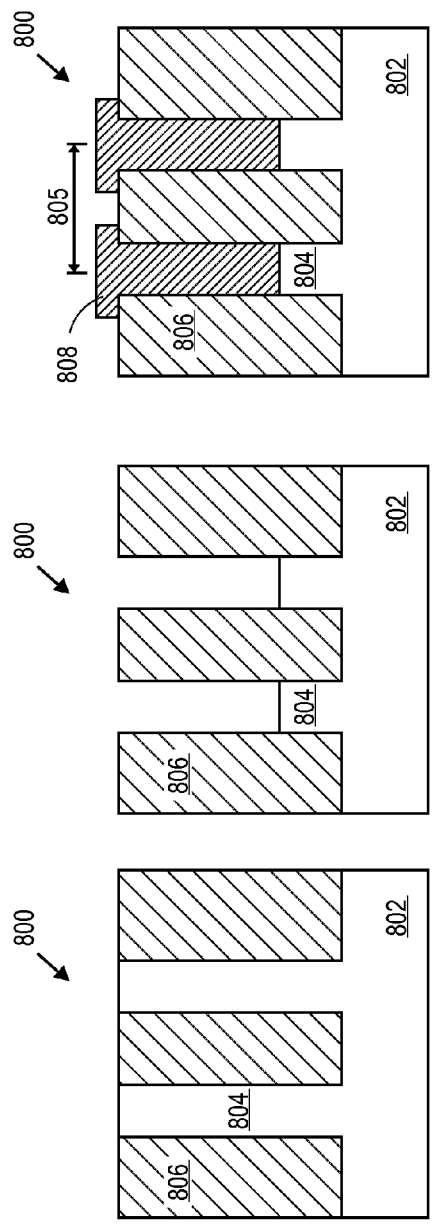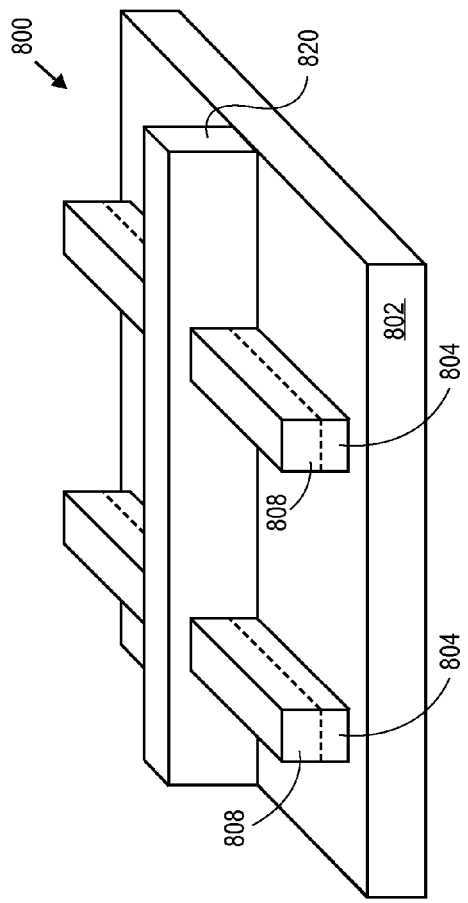
FIG. 8A  FIG. 8B  FIG. 8C  FIG. 8D

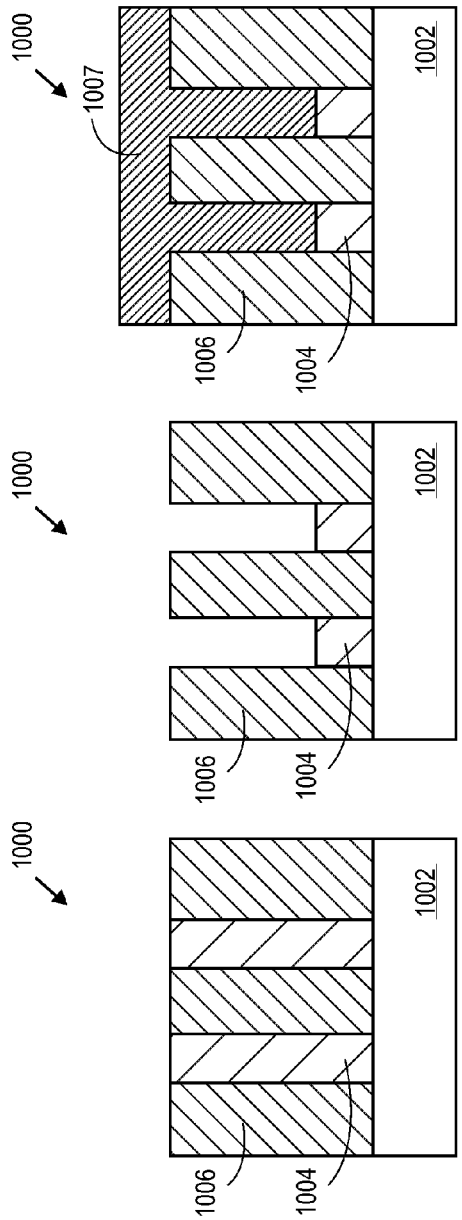
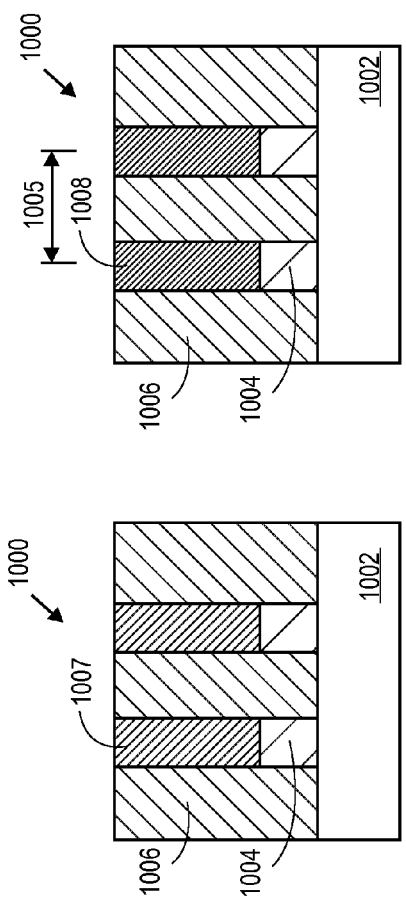

US 9,607,987 B2

METHODS FOR FORMING FINS FOR METAL OXIDE SEMICONDUCTOR DEVICE STRUCTURES

CROSS-REFERENCE TO RELATED APPLICATION

This patent application is a U.S. National Phase Application under 35 U.S.C. §371 of International Application No. PCT/US2011/066671, filed Dec. 21, 2011, entitled METHODS FOR FORMING FINS FOR METAL OXIDE SEMICONDUCTOR DEVICE STRUCTURES.

TECHNICAL FIELD

Embodiments of the present disclosure relate to methods for forming fins for metal oxide semiconductor device structures.

BACKGROUND

Microelectronic integrated circuits, such as microprocessors, comprise literally hundreds of millions of transistors. The speed of the integrated circuits is primarily dependent on the performance of these transistors. Thus, the industry has developed unique structures, such as non-planar transistors, to improve performance.

Alternative channel materials such as Germanium (Ge) enable higher performance transistors. These materials are integrated with a silicon substrate to be most useful. The integration scheme should allow selection of transistor material type for each transistor in the design. Heteroepitaxy of germanium on silicon is achieved today using wafer-scale or large area blanket growth using thick buffer layers of intermediate SiGe composition to accommodate the lattice mismatch defects. The thick buffer makes it difficult to form small Ge islands mixed with Si for use in a single circuit. This approach also suffers from relatively high defect density compared to conventional Si wafers.

BRIEF DESCRIPTION OF THE DRAWINGS

Embodiments of the present invention are illustrated by way of example, and not by way of limitation, in the figures of the accompanying drawings and in which:

FIGS. 4a-4g illustrate cross-sectional views for forming fins of a transistor, such as a PMOS device or NMOS device or the like, according to one embodiment of the invention;

FIGS. 6a-6j illustrate cross-sectional views for forming fins of a transistor, such as a PMOS device or NMOS device or the like, according to one embodiment of the invention;

FIGS. 8a-8d illustrate cross-sectional views for forming fins of a transistor, such as a PMOS device or NMOS device or the like, according to one embodiment of the invention;

FIGS. 10a-10f illustrate cross-sectional views for forming fins of a transistor, such as a PMOS device or NMOS device or the like, according to one embodiment of the invention;

DETAILED DESCRIPTION

Figure 1:
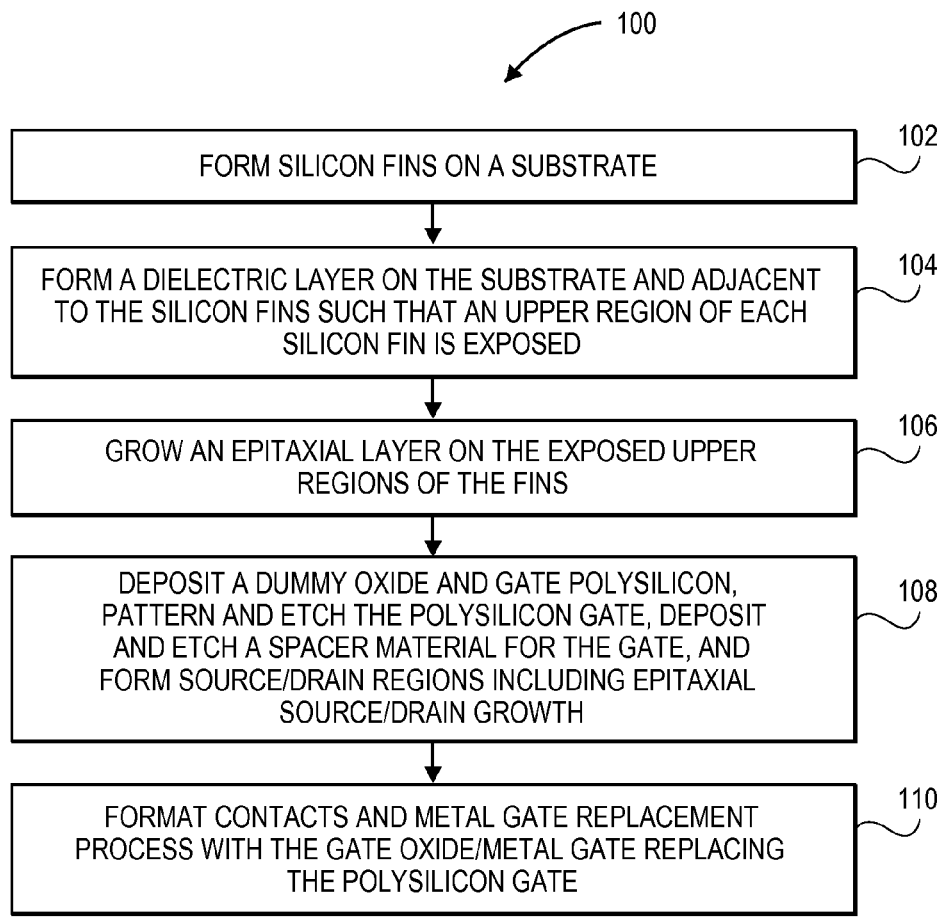
FIG. 1 is a flowchart illustrating a method 100 of forming a device (e.g., transistor) with fins according to one embodiment of the invention.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description. In the fabrication of non-planar transistors, such as tri-gate transistors and FinFETs, non-planar semiconductor bodies may be used to form transistors capable of full depletion with very small gate lengths (e.g., less than about 30 nm). These semiconductor bodies are generally fin-shaped and are, thus, generally referred to as transistor "fins." For example in a tri-gate transistor, the transistor fins have a top surface and two opposing sidewalls formed on a bulk semiconductor substrate or a silicon-on-insulator substrate. A gate dielectric may be formed on the top surface and sidewalls of the semiconductor body and a gate electrode may be formed over the gate dielectric on the top surface of the semiconductor body and adjacent to the gate dielectric on the sidewalls of the semiconductor body. Thus, since the gate dielectric and the gate electrode are adjacent to three surfaces of the semiconductor body, three separate channels and gates are formed. As there are three separate channels formed, the semiconductor body can be fully depleted when the transistor is turned on. With regard to finFET transistors, the gate material and the electrode only contact the sidewalls of the semiconductor body, such that two separate channels are formed (rather than three in tri-gate transistors).

Embodiments of the present description relate to the fabrication of microelectronic devices including tri-gate transistors and finFET transistors. In at least one embodiment, the present subject matter relates to methods of forming crystalline Ge fins only in the local regions required for transistors. These methods include selective growth methods for growing a thin Ge layer. The small volume of Ge allows growth without nucleation of extended defects. A fin is more mechanically compliant than a bulk substrate because the fin will stretch during thin film epitaxy reducing the stress in the grown layer and allowing the stable growth of thicker films. The selective growth does not require the use of buffer layers in contrast to prior approaches. The methods described herein include a selective growth of Ge on Si to form the fin body of a transistor. In an embodiment, the selective growth scheme allows the Ge to be separated from the Si seed to form a germanium-on-insulator (GOI) structure.

FIG. 1 is a flowchart illustrating a method 100 of forming a device (e.g., transistor) with fins according to one embodiment of the invention. The method 100 includes forming silicon fins on a substrate at block 102. For example, the substrate may be patterned with a photoresist mask and then etched to form the silicon fins. Then, the method 100 forms a dielectric layer on the substrate and adjacent to the silicon fins such that an upper region of each silicon fin is exposed at block 104. An epitaxial layer is then grown on the exposed upper regions of the fins at block 106. In one embodiment, germanium is epitaxially grown on the upper regions of silicon fins. In another embodiment, silicon germanium is epitaxially grown on the upper regions of silicon fins. In an embodiment, a group III-V material is grown on a group III-V substrate (e.g., GaAs) or a group IV substrate (e.g., Ge). The method 100 then continues with conventional transistor processing (e.g., Trigate or finfet processing). For example, this processing may include depositing a dummy oxide and gate polysilicon, patterning and etching the polysilicon gate, depositing and etching a spacer material for the gate, and forming source/drain regions including epitaxial source/drain growth at block 108. The processing may also include formation of contacts and metal gate replacement process with the gate oxide/metal gate replacing the polysilicon gate at block 110.

Figure 2A:
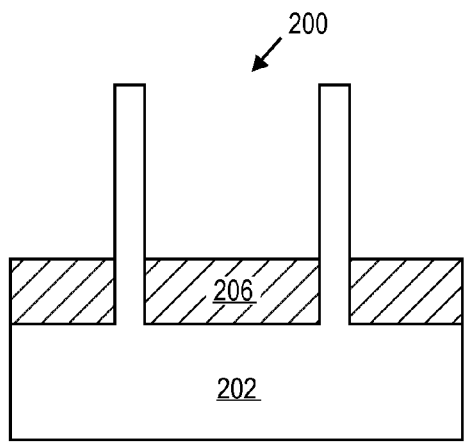
FIGS. 2a-2c illustrate cross-sectional views for forming fins of a transistor, such as a PMOS device or NMOS device or the like, according to one embodiment of the invention.
Figure 2B:
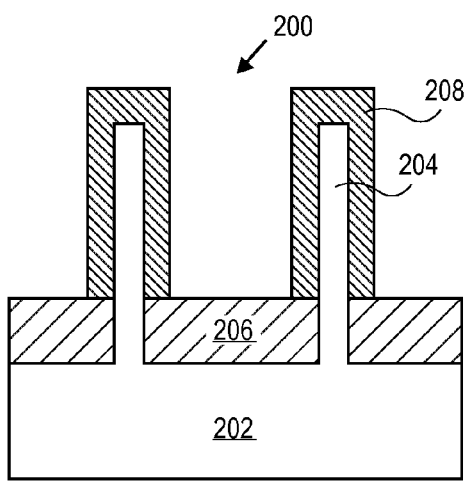
Figure 2C:
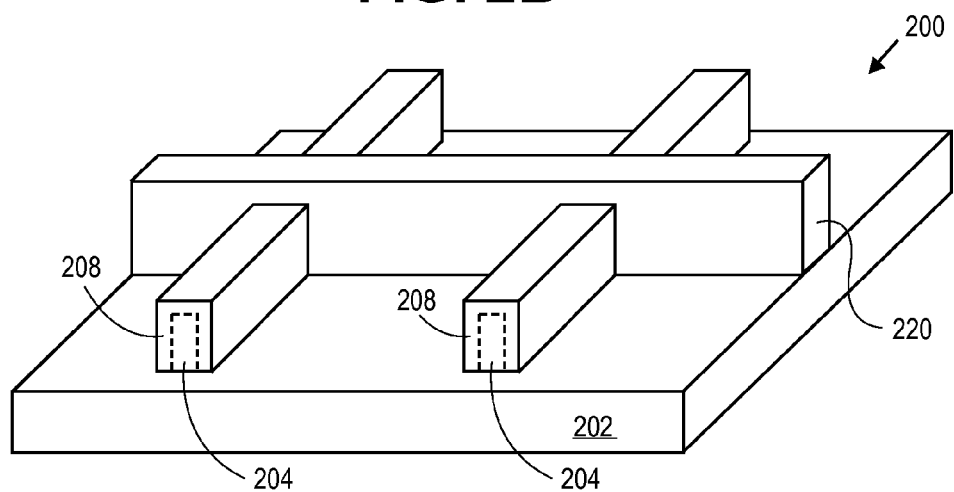

FIGS. 2a-2c illustrate cross-sectional views for forming fins of a transistor, such as a PMOS device or NMOS device or the like, according to one embodiment of the invention. The method 100 may be illustrated with these cross-sectional views. The device 200 includes a substrate 202, silicon fins 204 and dielectric layer 206 as illustrated in FIG. 2a. In this method, thin silicon fins are formed that will become the core of the transistor body (e.g., PMOS body). The thin silicon fins may also be used as a body of a NMOS device. A thin film 208 (e.g., germanium, silicon germanium) is then grown epitaxially on the Si cores to complete the transistor body as illustrated in FIG. 2b. Transistor processing continues and includes a dummy oxide and polysilicon gate 220 disposed over the fins as illustrated in FIG. 2c. The polysilicon gate 220 may be replaced with a gate oxide and metal gate in accordance with conventional processing.

In one embodiment, the silicon fins may have height of 30-50 nanometers, a width of 5-10 nanometers, and a pitch of 50-100 nanometers between fins. The film 208 may have a thickness of 5-10 nanometers depending on the film type.

Figure 3:
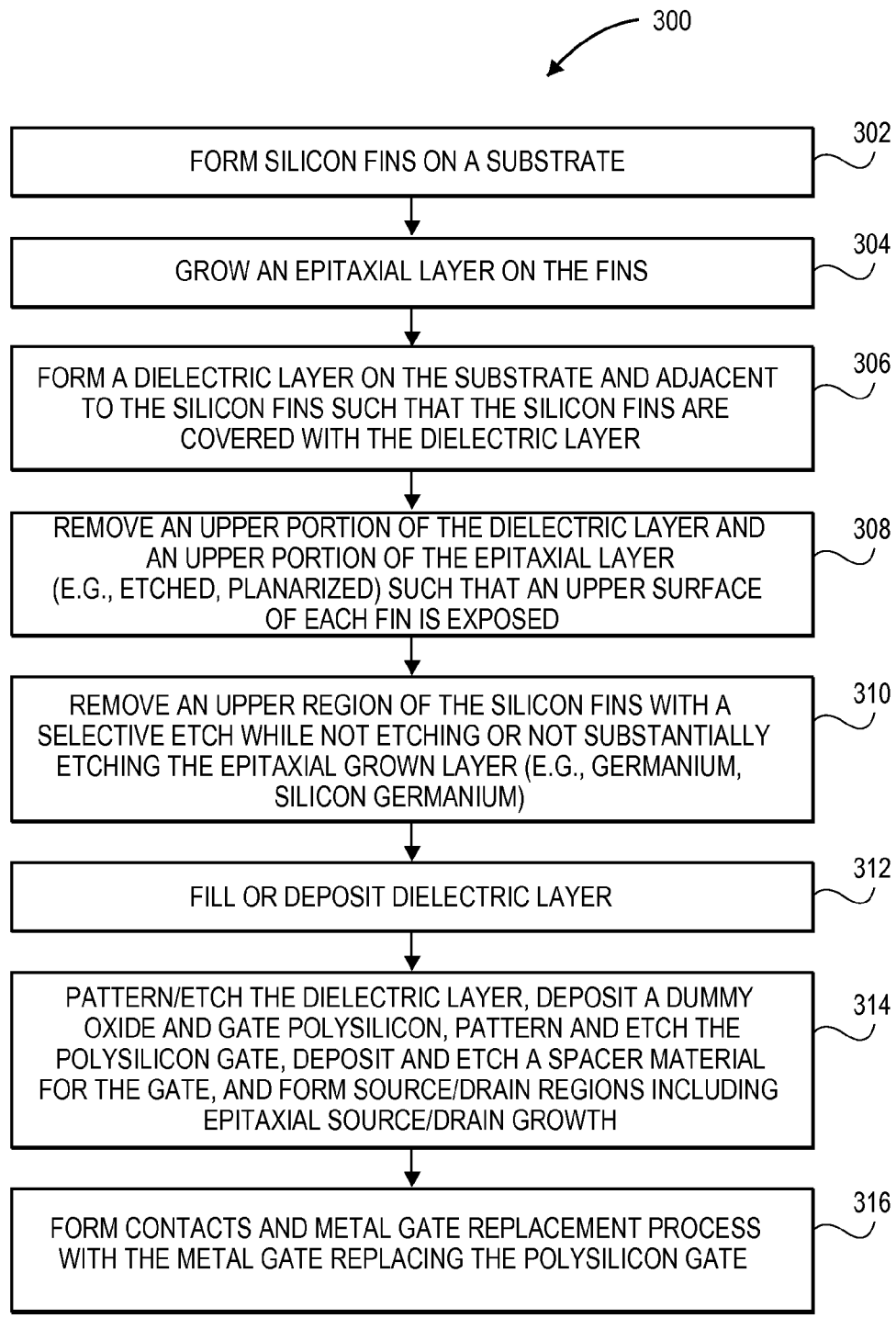
FIG. 3 is a flowchart illustrating a method 300 of forming a device (e.g., transistor) with fins according to one embodiment of the invention.

FIG. 3 is a flowchart illustrating a method 300 of forming a device (e.g., transistor) with fins according to one embodiment of the invention. The method 300 includes forming silicon fins on a substrate at block 302. For example, the substrate may be patterned with a photoresist mask and then etched to form the silicon fins. An epitaxial layer is then grown on the fins at block 304. In one embodiment, germanium is epitaxially grown on silicon fins. In another embodiment, silicon germanium is epitaxially grown on the silicon fins. In an embodiment, a group III-V material is grown on a group III-V substrate (e.g., GaAs) or a group IV substrate (e.g. Ge). Then, the method 300 forms a dielectric layer on the substrate and adjacent to the silicon fins such that the silicon fins are covered with the dielectric layer at block 306. An upper portion of the dielectric layer and an upper portion of the epitaxial layer is removed (e.g., etched, planarized) such that an upper surface of each fin is exposed at block 308. A selective etch removes an upper region of the silicon fins while not etching or not substantially etching the epitaxially grown layer (e.g., germanium, silicon germanium) at block 310. A dielectric layer fill or deposition occurs at block 312. The method 300 then continues with conventional transistor processing (e.g., Trigate or finfet processing). For example, this processing may include patterning/etching the dielectric layer, depositing a dummy oxide and gate polysilicon, patterning and etching the polysilicon gate, depositing and etching a spacer material for the gate, and forming source/drain regions including epitaxial source/drain growth at block 314. The processing may also include formation of contacts and metal gate replacement process with the metal gate replacing the polysilicon gate at block 316.

Figure 4G:
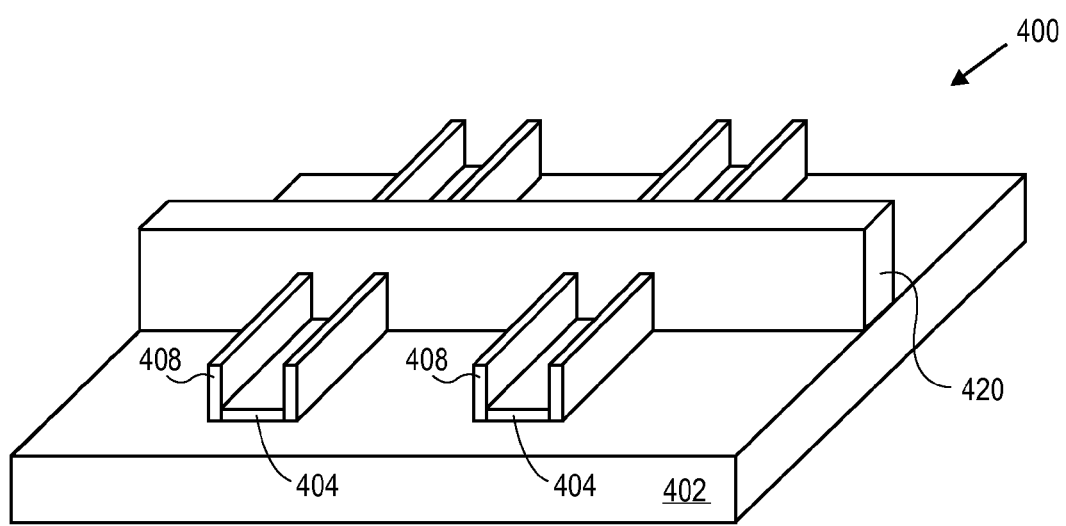

FIGS. 4a-4g illustrate cross-sectional views for forming fins of a transistor, such as a PMOS device or NMOS device or the like, according to one embodiment of the invention. The method 400 may be illustrated with these cross-sectional views. The device 400 includes a substrate 402 and silicon fins 404 as illustrated in FIG. 4a. In this method, thin silicon fins are formed that determine a pitch of Ge fins of the transistor body (e.g., PMOS body). The thin silicon fins may also be used as a body of a NMOS device. A thin film layer 408 (e.g., germanium, silicon germanium) is then grown epitaxially on the Si fins as illustrated in FIG. 4b. Then, the method 400 forms a dielectric layer 406 on the substrate and adjacent to the silicon fins such that the silicon fins are covered as illustrated in FIG. 4c. An upper portion of the dielectric layer and an upper portion of the epitaxial layer are removed (e.g., etched, planarized) such that an upper surface of each fin is exposed as illustrated in FIG. 4d. A selective etch removes an upper region of the silicon fins while not etching or substantially etching the epitaxially grown layer (e.g., germanium, silicon germanium) as illustrated in FIG. 4e. A dielectric layer fill or deposition occurs as illustrated in FIG. 4f. Transistor processing continues and includes a dummy oxide and polysilicon gate 40 disposed over the fins as illustrated in FIG. 4g. The polysilicon gate 420 may be replaced with a gate oxide and metal gate in accordance with conventional processing.

In one embodiment, the silicon fins may have height of 30-50 nanometers, a width of 10-50 nanometers, and a pitch 405 of 40-150 nanometers between fins. The film 408 may have a thickness of 5-10 nanometers depending on the film type and a pitch 409 of 20-80 nanometers depending on the type of film and design requirements. In an embodiment, the pitch 409 is one half the pitch 405 of the fins. The pitch of the silicon fins can be designed based on a desired pitch of the germanium fins. The method 400 forms Ge only fins with natural pitch doubling.

Figure 5:
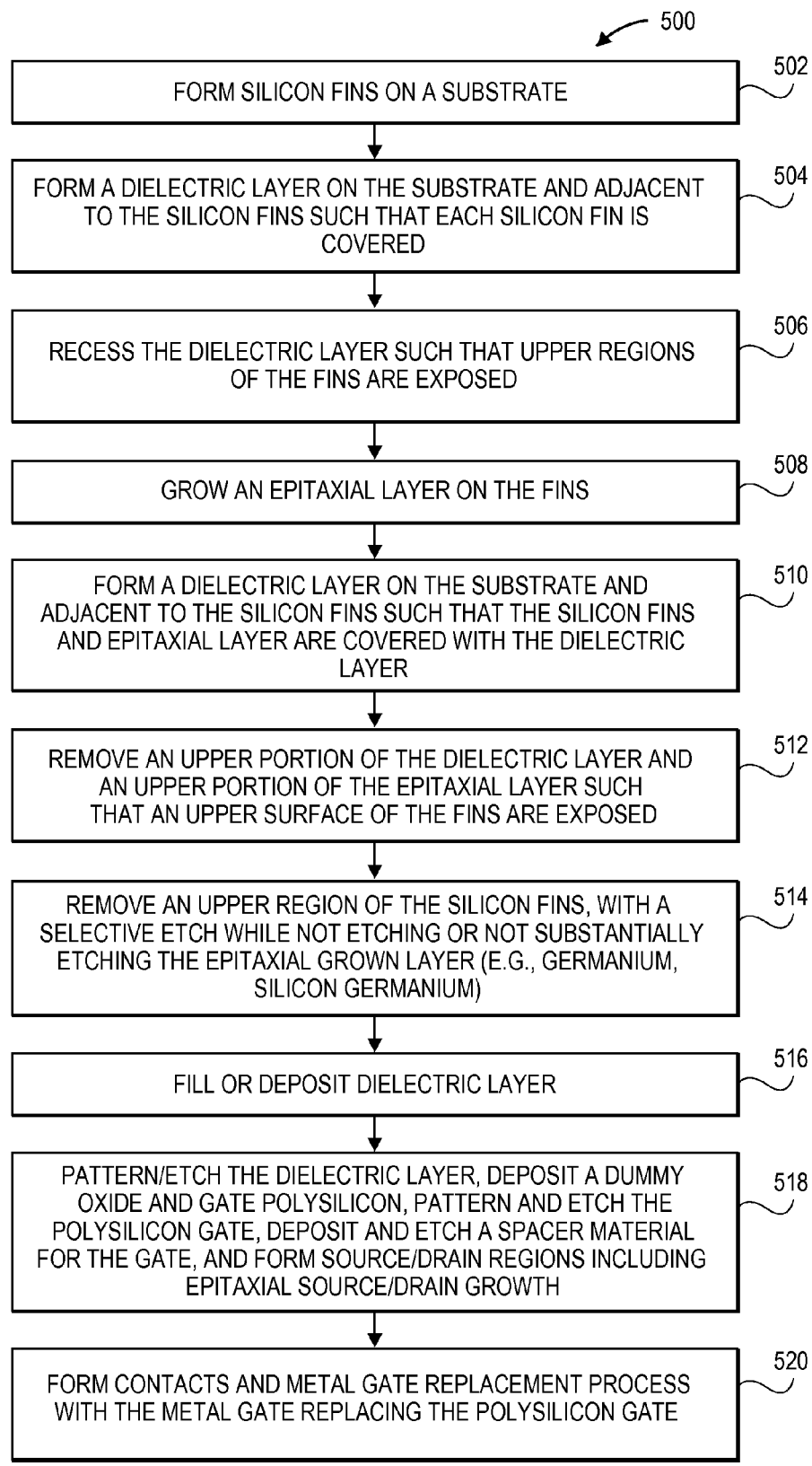
FIG. 5 is a flowchart illustrating a method 500 of forming a device (e.g., transistor) with fins according to one embodiment of the invention.

FIG. 5 is a flowchart illustrating a method 500 of forming a device (e.g., transistor) with fins according to one embodiment of the invention. The method 500 includes forming silicon fins on a substrate at block 502. For example, the substrate may be patterned with a photoresist mask and then etched to form the silicon fins. Then, the method 500 forms a dielectric layer on the substrate and adjacent to the silicon fins such that each silicon fin is covered at block 504. The dielectric layer is recessed such that upper regions of the fins are exposed at block 506. An epitaxial layer is then grown on the fins at block 508. In one embodiment, germanium is epitaxially grown on silicon fins. In another embodiment, silicon germanium is epitaxially grown on the silicon fins. In an embodiment, a group III-V material is grown on a group III-V substrate (e.g., GaAs) or a group IV substrate (e.g. Ge).

Then, the method 500 forms a dielectric layer on the substrate and adjacent to the silicon fins such that the silicon fins and epitaxial layer are covered with the dielectric layer at block 510. An upper portion of the dielectric layer and an upper portion of the epitaxial layer are removed (e.g., etched, planarized) such that an upper surface of the fins are exposed at block 512. A selective etch removes an upper region of the silicon fins while not etching or not substantially etching the epitaxially grown layer (e.g., germanium, silicon germanium) at block 514. A dielectric layer fill or deposition occurs at block 516. The method 500 then continues with conventional transistor processing (e.g., Trigate or finfet processing). For example, this processing may include patterning/etching the dielectric layer, depositing a dummy oxide and gate polysilicon, patterning and etching the polysilicon gate, depositing and etching a spacer material for the gate, and forming source/drain regions including epitaxial source/drain growth at block 518. The processing may also include formation of contacts and metal gate replacement process with the metal gate replacing the polysilicon gate at block 520.

FIGS. 6a-6j illustrate cross-sectional views for forming fins of a transistor, such as a PMOS device or NMOS or the like, according to one embodiment of the invention. The method 500 may be illustrated with these cross-sectional views. The device 600 includes a substrate 602 and silicon fins 604 as illustrated in FIG. 6a. In this method, thin silicon fins are formed that determine a pitch of Ge fins of the transistor body (e.g., PMOS body). The thin silicon fins may also be used as a body of a NMOS device. A dielectric layer 606 is formed on the substrate and adjacent to the silicon fins such that the silicon fins are covered as illustrated in FIG. 6b. An upper portion of the dielectric layer is removed (e.g., etched, planarized) such that an upper region of the fins are exposed as illustrated in FIG. 6c. A thin epitaxial layer 608 (e.g., germanium, silicon germanium) is then grown epitaxially on the silicon fins as illustrated in FIG. 6d. Then, a dielectric layer 606 is formed on the substrate and adjacent to the silicon fins such that the silicon fins are covered as illustrated in FIG. 6e. An upper portion of the dielectric layer and an upper portion of the epitaxial layer are removed (e.g., etched, planarized) such that an upper surface of the fins are exposed as illustrated in FIG. 6f. A selective etch removes an upper region of the silicon fins while not etching or substantially etching the epitaxially grown layer (e.g., germanium, silicon germanium) as illustrated in device 600 of FIG. 6g or device 630 of FIG. 6g'.

A dielectric layer fill or deposition occurs as illustrated in FIG. 6h or 6i. The device 600 in FIG. 6h is fabricated if the dielectric layer etch illustrated in FIG. 6c removes more of the dielectric layer than the silicon etch removes silicon in FIG. 6g. The device 630 in FIG. 6i is fabricated if the dielectric layer etch illustrated in FIG. 6c removes less of the dielectric layer than the silicon etch removes silicon in FIG. 6g'. The device 600 illustrated in FIG. 6h has an overlap between the germanium fin 608 and the silicon fin 604 while the device 630 illustrated in FIG. 6i does not include this overlap. The device 630 will likely have better device performance due to the lack of overlap and separation of the germanium fin 608, which is the transistor body, and the silicon fin 604 that is part of the silicon substrate 602. The device 630 is a semiconductor on insulator device.

Transistor processing continues and includes a dummy oxide and polysilicon gate 620 disposed over the fins as illustrated in FIG. 6j. The polysilicon gate 620 may be replaced with a gate oxide and metal gate in accordance with conventional processing.

In one embodiment, the silicon fins may have an initial height of 30-50 nanometers, a width of 10-50 nanometers, and a pitch 605 of 40-150 nanometers between fins. The layer 608 may have a thickness of 5-10 nanometers depending on the film type and a pitch 609 of 20-80 nanometers depending on the type of film and design requirements. In an embodiment, the pitch 609 is one half the pitch 605 of the fins. The pitch of the silicon fins can be designed based on a desired pitch of the germanium fins. The method 500 forms Ge only fins with natural pitch doubling.

The method 500 is similar to the method 300, except that the starting silicon fins are processed further following the processing flow to the oxide recess as illustrated in FIG. 6c. A thin Ge film is then selectively grown epitaxially on the silicon fins and processing continues as in method 300. There are two possible resulting structures 600 and 630 as illustrated in FIGS. 6h and 6i, respectively. The method 500 has the advantage of having a smaller Ge growth area (i.e., just the active fin regions) compared to the methods 100 and 300. This method 500 allows the growth of a thicker Ge film before defects are nucleated.

Figure 7:
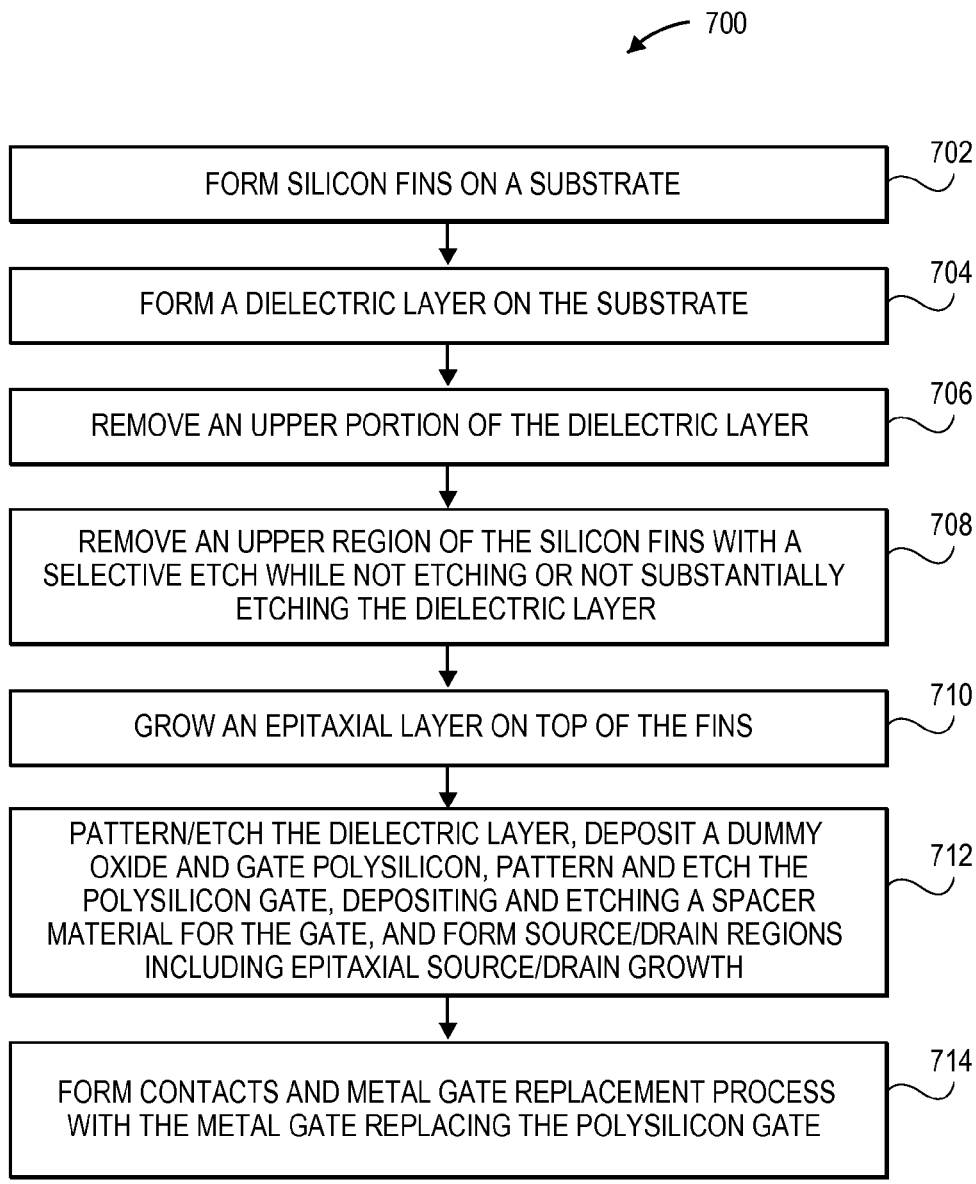
FIG. 7 is a flowchart illustrating a method 700 of forming a device (e.g., transistor) with fins according to one embodiment of the invention.

FIG. 7 is a flowchart illustrating a method 700 of forming a device (e.g., transistor) with fins according to one embodiment of the invention. The method 700 includes forming silicon fins on a substrate at block 702, forming a dielectric layer on the substrate at block 704, and removing an upper portion of the dielectric layer at block 706. For example, the substrate may be patterned with a photoresist mask and then etched to form the silicon fins. Then, a dielectric layer is formed on the substrate and recessed back such that an upper surface of the silicon fins are exposed. A selective etch removes an upper region of the silicon fins while not etching or not substantially etching the dielectric layer at block 708. An epitaxial layer is then grown on top of the fins at block 710. In one embodiment, germanium is epitaxially grown on silicon fins. In another embodiment, silicon germanium is epitaxially grown on top of the silicon fins. In an embodiment, a group III-V material is grown on a group III-V substrate (e.g., GaAs) or a group IV substrate (e.g., Ge). The method 700 then continues with conventional transistor processing (e.g., Trigate or finfet processing). For example, this processing may include patterning/etching the dielectric layer, depositing a dummy oxide and gate polysilicon, patterning and etching the polysilicon gate, depositing and etching a spacer material for the gate, and forming source/drain regions including epitaxial source/drain growth at block 712. The processing may also include formation of contacts and metal gate replacement process with the metal gate replacing the polysilicon gate at block 714.

FIGS. 8a-8d illustrate cross-sectional views for forming fins of a transistor, such as a PMOS device or NMOS device or the like, according to one embodiment of the invention. The method 700 may be illustrated with these cross-sectional views. The device 800 includes a substrate 802, a dielectric layer 806, and silicon fins 804 as illustrated in FIG. 8a. In this method, thin silicon fins are formed that will provide a silicon seed for growing an epitaxial layer that is used as a transistor body (e.g., PMOS body). The thin silicon fins may also be used as a body of a NMOS device. A selective etch removes an upper region of the silicon fins while not etching or not substantially etching the dielectric layer as illustrated in FIG. 8b. A thin film 808 (e.g., germanium, silicon germanium) is then grown epitaxially on top of the silicon fins as illustrated in FIG. 8c. Transistor processing continues and includes a dummy oxide and polysilicon gate 820 disposed over the fins as illustrated in FIG. 8d. The polysilicon gate 1020 may be replaced with a gate oxide and metal gate in accordance with conventional processing.

In one embodiment, the silicon fins may have height of 30-50 nanometers, a width of 10-100 nanometers, and a pitch 805 of 40-150 nanometers between fins. The film 808 may have a thickness of 10-100 nanometers depending on the film type and the same pitch as pitch 805.

This method 700 produces a device 800 with silicon fins matching the final intended germanium fin pitch.

Figure 9:
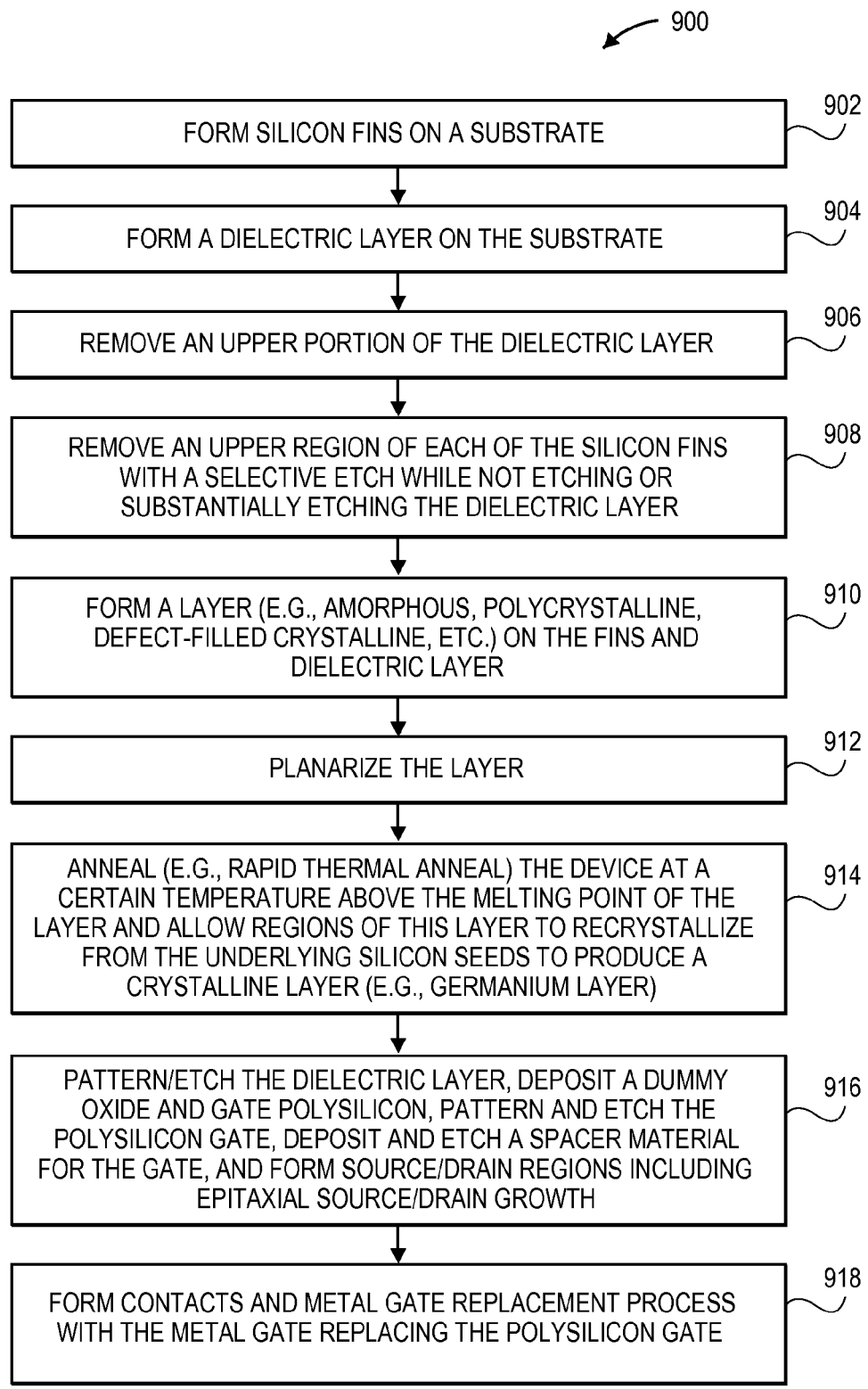
FIG. 9 is a flowchart illustrating a method 900 of forming a device (e.g., transistor) with fins according to one embodiment of the invention.

FIG. 9 is a flowchart illustrating a method 900 of forming a device (e.g., transistor) with fins according to one embodiment of the invention. The method 900 includes forming silicon fins on a substrate at block 902, forming a dielectric layer on the substrate at block 904, and removing an upper portion of the dielectric layer at block 906. For example, the substrate may be patterned with a photoresist mask and then etched to form the silicon fins. Then, a dielectric layer is formed on the substrate and recessed back such that an upper surface of the silicon fins is exposed. A selective etch removes an upper region of each of the silicon fins while not etching or substantially etching the dielectric layer at block 908. A layer (e.g., amorphous, polycrystalline, defect-filled crystalline, etc.) is then formed (e.g., deposition, epitaxial growth) on the fins and dielectric layer at block 910. In one embodiment, germanium is formed on top of the silicon fins. In another embodiment, silicon germanium is formed on the silicon fins. In an embodiment, a group III-V material is formed on a group III-V substrate (e.g., GaAs) or a group IV substrate (e.g. Ge). The layer is planarized at block 912. The device is annealed (e.g., rapid thermal anneal) at a certain temperature above the melting point of the layer and this allows regions of this layer to recrystallize from the underlying silicon seeds to produce a crystalline layer (e.g., germanium layer) at block 914. The order of the planarization and annealing may be switched. The method 900 then continues with conventional transistor processing (e.g., Trigate or finfet processing). For example, this processing may include patterning/etching the dielectric layer, depositing a dummy oxide and gate polysilicon, patterning and etching the polysilicon gate, depositing and etching a spacer material for the gate, and forming source/drain regions including epitaxial source/drain growth at block 916. The processing may also include formation of contacts and metal gate replacement process with the metal gate replacing the polysilicon gate at block 918.

Figure 10F:
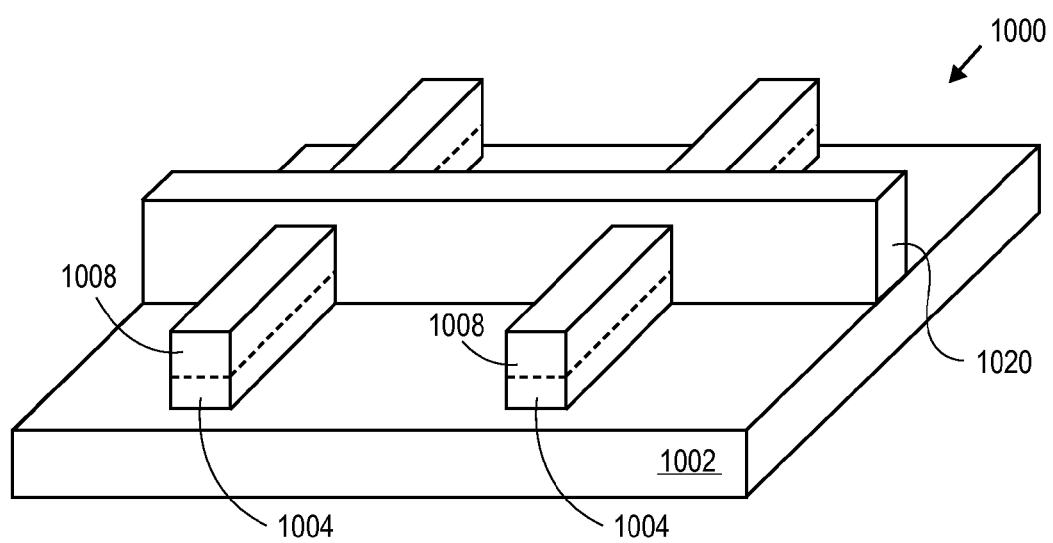

FIGS. 10a-10f illustrate cross-sectional views for forming fins of a transistor, such as a PMOS device or NMOS device or the like, according to one embodiment of the invention. The method 900 may be illustrated with these cross-sectional views. The device 1000 includes a substrate 1002, a dielectric layer 1006, and silicon fins 1004 as illustrated in FIG. 10a. In this method, thin silicon fins are formed that will provide a silicon seed for recrystallizing a deposited layer that is used as a transistor body (e.g., PMOS body) after recrystallization. The thin silicon fins may also be used as a body of a NMOS device. A selective etch removes an upper region of the silicon fins while not etching or not substantially etching the dielectric layer as illustrated in FIG. 10b. A layer 1008 (e.g., amorphous, polycrystalline, defect-filled crystalline, etc.) is then formed (e.g., deposition, epitaxial growth) on the fins as illustrated in FIG. 10c. In one embodiment, germanium is formed on silicon fins. In another embodiment, silicon germanium is formed on the silicon fins. The layer is planarized as illustrated in FIG. 10d. The device is annealed (e.g., rapid thermal anneal) at a certain temperature above the melting point of the layer and this allows regions of this layer to recrystallize from the underlying silicon seeds to produce a crystalline layer (e.g., germanium layer) as illustrated in FIG. 10e. Transistor processing continues and includes a dummy oxide and polysilicon gate 1020 disposed over the fins as illustrated in FIG. 10f. The polysilicon gate 1020 may be replaced with a gate oxide and metal gate in accordance with conventional processing.

In one embodiment, the silicon fins may have height of 30-50 nanometers, a width of 10-100 nanometers, and a pitch 1005 of 40-150 nanometers between fins. The film 1008 may have a thickness of 10-100 nanometers depending on the film type and the same pitch as pitch 1005. This method 900 produces a device 1000 with silicon fins matching the final intended germanium fin pitch.

In one embodiment, the method 900 forms silicon fins and recesses them within the surrounding oxide. Germanium is deposited to fill the trenches, but this does not need to be an epitaxial growth operation. Amorphous, polycrystalline, or defect-filled crystalline Ge deposition is also possible. After planarization, a rapid thermal anneal above the melting point of Ge is used to melt just the Ge regions and then allow them to recrystallize from the underlying silicon seed to produce a crystalline Ge fin. The order of planarization and melt annealing can be exchanged. A rapid thermal or laser anneal minimizes interdiffusion of the germanium and silicon at the fin boundary.

In an embodiment of the present disclosure, a substrate may be a monocrystalline silicon substrate. The substrate may also be other types of substrates, such as silicon-on-insulator ("SOI"), germanium, gallium arsenide, indium antimonide, lead telluride, indium arsenide, indium phosphide, gallium arsenide, gallium antimonide, and the like, any of which may be combined with silicon.

The gate dielectric layers may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate dielectric layers can be formed by well-known techniques, such as by depositing a gate electrode material, such as chemical vapor deposition ("CVD"), physical vapor deposition ("PVD"), atomic layer deposition ("ALD"), and then patterning the gate electrode material with well-known photolithography and etching techniques, as will be understood to those skilled in the art.

It is understood that a source region and a drain region (not shown) may be formed in the transistor fins on opposite sides of the gate electrodes. The source and drain regions may be formed of the same conductivity type, such as N-type or P-type conductivity. The source and drain regions may have a uniform doping concentration or may include sub-regions of different concentrations or doping profiles such as tip regions (e.g., source/drain extensions). In some implementations of an embodiment of the present disclosure, the source and drain regions may have the substantially the same doping concentration and profile while in other implementations they may vary.

Figure 11:
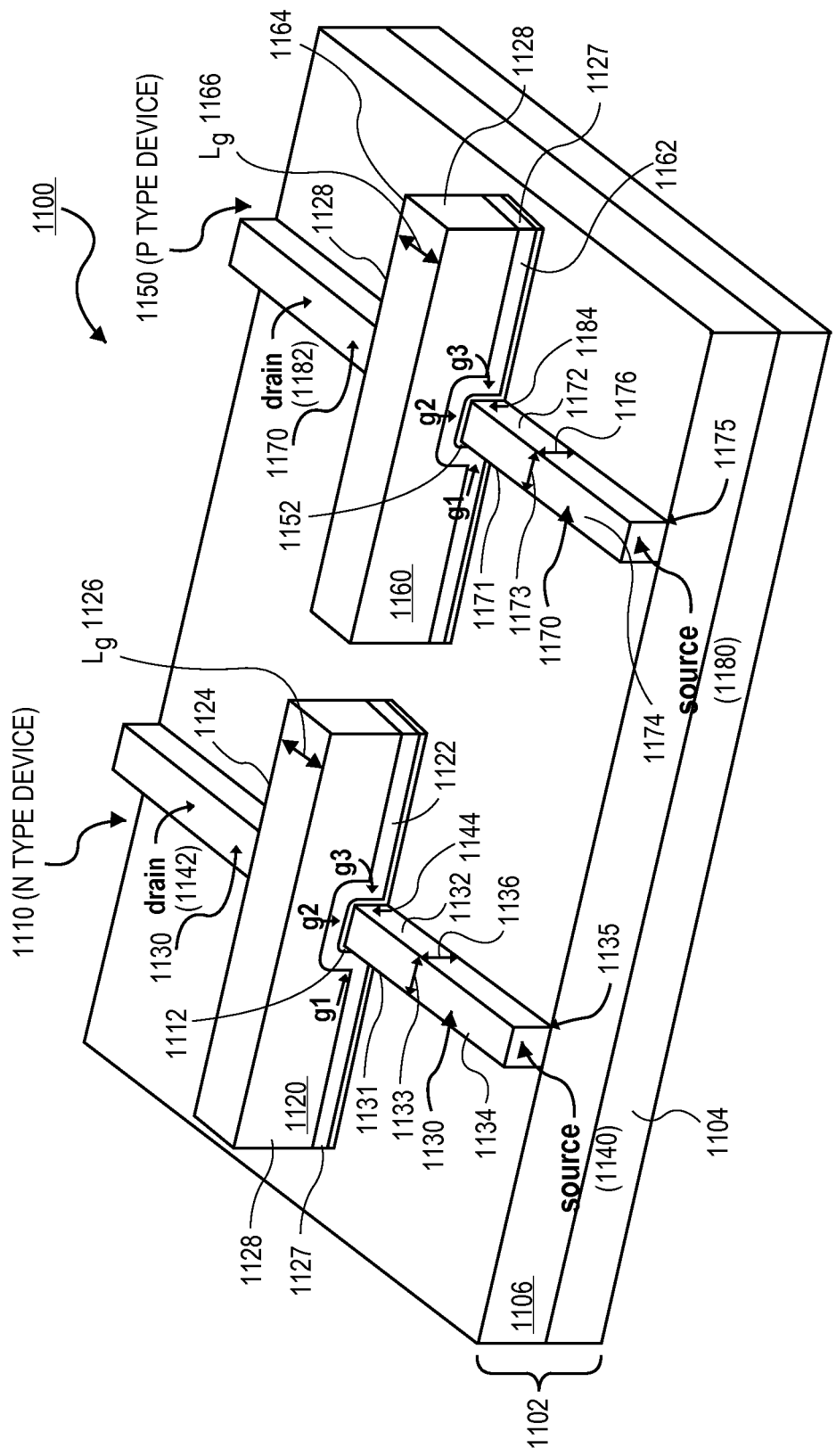
FIG. 11 shows a portion of a complementary metal oxide semiconductor (CMOS) integrated circuit 1300 which includes both n type nonplanar transistor 1310 with a metal gate electrode 1320 and p type nonplanar transistor 1350 in accordance with an embodiment of the invention.

An example of nonplanar transistors in accordance with embodiments of the present invention are illustrated in FIG. 11. FIG. 11 shows a portion of a complementary metal oxide semiconductor (CMOS) integrated circuit 1100 which includes both an n type nonplanar transistor 1110 with a metal gate electrode 1120 and p type nonplanar transistor 1150 with a metal gate electrode 1152 formed on an insulating substrate 1102. An n type transistor 1110 is a field effect transistor where the carriers are electrons and a p type transistor 1150 is a transistor where the carriers are holes. N type transistor 1110 and p type transistor 1150 are coupled together through higher levels of metallization into a functional CMOS circuit. Although, a CMOS integrated circuit 1100 is shown and described with respect to FIG. 11, embodiments of the present invention is not limited to a CMOS integrated circuit and can include circuits which include only a p type non-planar transistors with a metal gate electrodes or only an n type nonplanar transistors with metal gate electrodes. In one embodiment, methods described herein can be used to make Ge fins for PMOS devices and use regular Si fins for NMOS devices for the CMOS integrated approach shown in FIG. 11. More generally, in other embodiments, one of the disclosed methods can be used to make NMOS fins of one material type and another of the methods to make PMOS fins of a different material type.

CMOS integrated circuit 1100 can be formed on an insulating substrate 1102. In an embodiment of the present invention, insulating substrate 1102 includes a lower monocrystalline silicon substrate 1104 upon which formed in insulating layer 1106, such as a silicon dioxide film. Integrated circuit 1100, however, can be formed on any suitable insulating substrate, such as substrates formed from silicon dioxide, nitrides, oxides, and sapphires.

Additionally, in an embodiment of the present invention, substrate 1102 need not necessarily be an insulating substrate can be a well known semiconductor substrate, such as but not limited to a monocrystalline silicon substrate and gallium arsenide substrate.

N type nonplanar transistor 1110 includes a semiconductor body 1130 formed on insulating layer 1106 of insulating substrate 1102 and p type nonplanar transistor 1150 includes a semiconductor body 1170 formed on insulating layer 1106 of insulating substrate 1102. Semiconductor bodies 1130 and 1170 can be formed from any well known semiconductor material, such as but not limited to silicon, germanium, silicon germanium ($Si_xGe_y$), gallium arsenide (GaAs), InSb, GaP, GaSb, carbon nanotubes and carbon nanowires. Semiconductor bodies 1130 and 1170 can be formed of any well know material which can be reversibly altered from an insulating state to a conductive state by applying external electrical controls. Semiconductor bodies 1130 and 1170 are ideally a single crystalline film when the best electrical performance of transistors 1110 and 1150 is desired. For example, semiconductor bodies 1130 and 1170 are single crystalline films when CMOS integrated circuit 1100 is used in high performance applications, such as in high density circuits, such as a microprocessor. Semiconductor bodies 1130 and 1170, however, can be a polycrystalline films when CMOS integrated circuit 1100 is used in applications requiring less stringent performance, such as in liquid crystal displays. Insulating layer 1106 insulates semiconductor bodies 1130 and 1170 from the monocrystalline silicon substrate 1102. In an embodiment of the present invention, semiconductor bodies 1130 and 1170 are single crystalline silicon films.

Semiconductor body 1130 has a pair of laterally opposite sidewalls 1131 and 1132 separated by distance which defines a semiconductor body width 1133. Additionally, semiconductor body 1130 has top surface 1134 opposite a bottom surface 1135 formed on substrate 1102. The distance between the top surface 1134 and the bottom surface 1135 defines the body height 1136. In an embodiment of the present invention, the body height 1136 is substantially equal to the body width 1135. In an embodiment of the present invention, the body 1130 has a height 1136 less than 50 nanometers and a width 1133 less than 20 nanometers. In an embodiment of the present invention, the body height 1136 is between two times the body width 1133 to ten times the body width 1133.

Similarly, semiconductor body 1170 has a pair of laterally opposite sidewalls 1171 and 1172 separated by a distance 1173 which defines a semiconductor body width 1173. Additionally, semiconductor body 1170 has a top surface 1174 opposite a bottom surface 1175 formed on substrate 1102. The distance between the top surface 1174 and the bottom surface 1175 defines the body height 1176. In an embodiment of the present invention, the body height 1176 is between two times the body width 1133 to ten times the body width 1173.

N type nonplanar transistor 1110 has a gate dielectric layer 1112. Gate dielectric layer 1112 is formed on and around three sides of semiconductor body 1130 as shown in FIG. 11. Gate dielectric layer 1112 is formed on or adjacent to sidewall 1131, on the top surface 1134, and on or adjacent to sidewall 1132 of body 1130 as shown in FIG. 11. Similarly, nonplanar p type transistor 1150 has a gate dielectric layer 1152. Gate dielectric layer 1152 is formed on and around three sides of semiconductor body 1170 as shown in FIG. 11. Gate dielectric layer 1152 is formed on or adjacent to sidewall 1171, on the top surface 1174 and on or adjacent to sidewall 1172 of body 1170 as shown in FIG. 11. Gate dielectric layers 1112 and 1152 can be formed from any well known gate dielectric films. In an embodiment of the present invention, the gate dielectric layers are silicon dioxide ($SiO_2$), silicon oxynitride ($SiO_xN_y$), or a silicon nitride ($Si_3N_4$) dielectric layer or combinations thereof. In an embodiment of the present invention, the gate dielectric layer 1112 and 1152 are a silicon oxynitride film formed to a thickness between 5-20 Å. In an embodiment of the present invention, the gate dielectric layer 1112 and 1152 are a high K gate dielectric layer, such as a metal dielectric, such as but not limited to tantalum oxide, titanium oxide, hafnium oxide, zirconium oxide, aluminum oxide, lanthanum oxide, lanthanum aluminum oxide and silicates thereof. In an embodiment of the present invention, dielectric layer 1112 and 1152 can be other types of high K dielectric layers, such as but not limited to PZT and BST.

N type nonplanar device 1110 has a gate electrode 1120. Gate electrode 1120 is formed on and around gate dielectric layer 1112 as shown in FIG. 11. Gate electrode 1120 is formed on or adjacent to gate dielectric layer 1112 formed on sidewall 1131 of semiconductor body 1130, is formed on gate dielectric layer 1112 formed on the top surface 1134 of semiconductor body 1130, and is formed adjacent to or on gate dielectric layer 1112 formed on sidewall 1132 of semiconductor body 1120. Gate electrode 1120 has a pair of laterally opposite sidewalls 1122 and 1124 separated by a distance which defines the gate length 1126 of n type transistor 1110. In an embodiment of the present invention, the laterally opposite sidewalls 1122 and 1124 of the gate electrode 1120 run in a direction perpendicular to the laterally opposite sidewalls 1131 and 1132 of semiconductor body 1130. Similarly, p type nonplanar device 1150 has a gate electrode 1160 formed on and around gate dielectric layer 1152 as shown in FIG. 11. Gate electrode 1160 is formed on or adjacent to gate dielectric layer 1152 formed on sidewall 1171 of semiconductor body 1170, is formed on gate dielectric layer 1152 formed on the top surface 1174 of semiconductor body 1170 and is formed adjacent to or on gate dielectric layer 1152 formed on sidewall 1172 of semiconductor body 1170. Gate electrode 1170 has a pair of laterally opposite sidewalls 1162 and 1164 separated by a distance which defines a gate length (Lg) 1166 of p type transistor 1150. In an embodiment of the present invention, the laterally opposite sidewalls 1162 and 1164 of gate electrode 1160 run in a direction perpendicular to laterally opposite sidewalls 1171 and 1172 of semiconductor body 1170.

In an embodiment of the present invention, gate electrodes 1120 and 1160 are formed from a composite film comprising a lower metal film 1127 and an upper metal or doped polysilicon film 1128. In an embodiment of the present invention, the lower metal film 1127 controls the work function of the gate electrode material. In an embodiment of the present invention, the lower metal portion 1127 of the gate electrodes 1120 and 1160 is formed to a thickness of at least 25 Å or four monolayers so that the work function of the gate electrode material is controlled by the lower metal film. That is, in an embodiment of the present invention, the lower metal film is formed thick enough so that it is not "work function transparent" so that the work function of the gate electrode material is controlled by the lower metal film 1127 and not by the upper metal film 1128. In an embodiment of the present invention, the lower metal film 1127 is formed to a thickness between 25-100 Å and is formed from nitride or carbides of titanium and tantalum, such as but not limited to TaN, TiN, and aluminum doped titanium carbide. In an embodiment of the present invention, the upper metal film 1128 is formed of a material which has good gap fill characteristics and which has low resistance, such as but not limited tungsten (W), copper (Cu), or doped polysilicon.

N type nonplanar transistor 1110 has a source region 1140 and a drain region 1142. Source region 1140 and drain region 1142 are formed in semiconductor body 1108 on opposite sides of gate electrode 1120 as shown in FIG. 11. Source region 1140 and drain region 1142 are formed of n type conductivity. In an embodiment of the present invention, source 1140 and drain region 1142 have a n type dopant concentration between $1 \times 10^{19}$ to $1 \times 10^{21}$ atoms/cm$^3$. Source region 1140 and drain region 1142 can be a uniform concentration or can include subregions of different concentrations or dopant profiles, such as tip regions (e.g., source/drain extensions). In an embodiment of the present invention, when nonplanar n type transistor 1110 is a symmetrical transistor, source region 1140 and drain region 1142 have the same doping concentration and profile. In an embodiment of the present invention, the nonplanar n type transistor 1110 is formed as an asymmetrical transistor wherein the doping concentration profile of the source region 1140 and drain region 1142 may vary in order to obtain particular electrical characteristics.

Similarly, p type nonplanar transistor 1150 has a source region 1180 and drain region 1182. Source region 1180 and drain region 1182 are formed in semiconductor body 1170 on opposite sides of gate electrode 1160 as shown in FIG. 11. The source region 1180 and the drain region 1182 are formed of p type conductivity. In an embodiment of the present invention, the source region 1180 and drain region 1182 have a p type doping concentration of between $1 \times 10^{19}$ to $1 \times 10^{21}$ atoms/cm$^3$. Source region 1180 and drain region 1182 can be formed of uniform concentration or can include subregions of different concentration dopants profiles, such as tip regions (e.g., source/drain regions extensions). In an embodiment of the present invention, when nonplanar p type transistor 1150 is a symmetrical transistor, source region 1180 and drain 1182 have the same doping concentration and profile. In the embodiment of the present invention, when p type nonplanar transistor 1150 is formed as an asymmetrical transistor, then the doping concentration profile of source region 1180 and drain region 1182 may vary in order to obtain particular electrical characteristics.

The portion of semiconductor body 1130 located between source region 1140 and drain region 1142 defines a channel region 1144 of the n type nonplanar transistor 1110. The channel region 1144 can also be defined as the area of the semiconductor body 1130 surrounded by the gate electrode 1120. Similarly, the portion 1184 of semiconductor body 1170 located between source region 1180 and drain region 1182 defines a channel region 1184 of p type nonplanar transistor 1150. Channel region 1184 can also be defined as the area of the semiconductor body 1170 surrounded by gate electrode 1160. The source/drain regions typically extend slightly beneath the gate electrodes through, for example, diffusion to define a channel region slightly smaller than the gate electrode length (Lg). In an embodiment of the present invention, the channel regions 1144 and 1184 are intrinsic or undoped monocrystalline germanium. In an embodiment of the present invention, channel regions 1144 or 1184 are doped monocrystalline germanium. When channel region 1144 is doped, it is typically doped to a p type conductivity level between intrinsic and $4 \times 10^{19}$ atoms/cm$^3$. When channel region 1184 is doped it is typically doped to a n type conductivity level between intrinsic and $4 \times 10^{19}$ atoms/cm$^3$. In an embodiment of the present invention, channel regions 1144 and 1184 are doped to a concentration between $1 \times 10^{18}$-$1 \times 10^{19}$ atoms/cm$^3$. Channel regions 1144 and 1184 can be uniformly doped or can be doped nonuniformly or with different concentrations to provide particular electrical performance characteristics. For example, channel regions 1144 and 1184 can include well known "halo" regions, if desired.

By providing a gate dielectric 1112 and a gate electrode 1120 which surrounds the semiconductor body 1130 on three sides, the n type nonplanar transistor 1110 is characterized in having three channels and three gates, one gate (g1) which extends between the source and drain regions on side 1131 of semiconductor body 1130, a second (g2) which extends between the source and drain regions on the top surface 1134 of semiconductor body 1130, and a third (g3) which extends between the source and drain regions on the sidewall 1132 of semiconductor body 1130. As such, nonplanar transistor 1110 can be referred to as a tri-gate transistor. The gate width (Gw) of the transistor 1110 is the sum of the width of the three channel regions. That is, gate width of transistor 1110 is equal to the height 1136 of semiconductor body 1130 at sidewall 1131, plus the width of semiconductor body 1130 at the top surface 1134, plus the height 1136 of semiconductor body 1130 at sidewall 1132. Similarly, by providing a gate dielectric 1152 and a gate electrode 1160 which surrounds a semiconductor body 1170 on three sides, nonplanar p type transistor 1150 is characterized as having three channels and three gates, one channel and gate (g1) which extends between the source and drain regions on side 1171 of semiconductor body 1170, a second channel and gate (g2) which extends between the source and drain regions on the top surface 1174 of semiconductor body 1170, and a third channel and gate (g3) which extends between the source and drain regions on a sidewall 1172 of semiconductor body 1170. As such, nonplanar transistor 1150 can be referred to as a tri-gate transistor. The gate "width" (Gw), a transistor 1150 is a sum of the width of the three channel regions. That is, the gate width of the transistor 1150 is equal to the height 1176 of semiconductor body 1170 at sidewall 1171, plus the width 1173 of semiconductor body 1170 at the top surface 1174, plus the height 1176 of the semiconductor body 1170 of sidewall 1172. Larger width n type and p type nonplanar transistor can be obtained by using multiple devices coupled together (e.g., multiple silicon bodies 1130 surrounded by a single gate electrode 1120 or multiple semiconductor bodies 1170 surrounded by a single gate electrode 1160).

Because the channel regions 1144 and 1184 are surrounded on three sides by gate electrode 1120 and 1160, transistors 1110 and 1150 can be operated in a fully depleted manner wherein when transistors 1110 and 1150 are turned "on" the channel region 1150 fully depletes thereby providing the advantageous electrical characteristics and performance of a fully depleted transistor. That is, when transistors 1110 and 1150 are turned "ON" a depletion region is formed in the channel region along with an inversion layer at the surfaces of the channel regions 1144 and 1184 (i.e., an inversion layer is formed on the side surfaces and top surface of the semiconductor body). The inversion layer has the same conductivity type as the source and drain regions and forms a conductive channel between the source and drain regions to allow current to flow there-between. The depletion region depletes free carriers from beneath the inversion layer. The depletion region extends to the bottom of channel regions 1144 and 1184, thus the transistor can be said to be a "fully depleted" transistor. Fully depleted transistors have improved electrical performance characteristics over non-fully depleted or partially depleted transistors. For example, operating transistors 1110 and 1150 in a fully depleted manner, gives the transistors an ideal or very steep sub-threshold slope. Additionally, operating transistors 1110 and 1150 in the fully depleted manner, transistors 1110 and 1150 have improved drain induced barrier (DIBL) lowing effect which provides for better "OFF" state leakage which results in lower leakage and thereby lower power consumption. It is to be appreciated that transistor 1110 and 1150 need not necessarily be operated in a fully depleted manner, if desired (e.g., semiconductor bodies can be made large so they do not fully deplete).

The transistors 1110 and 1150 of embodiments of the present invention can be said to be a nonplanar transistor because the inversion layer of the channel regions 1144 and 1184 are formed in both the horizontal and vertical directions in semiconductor bodies 1130 and 1170. The semiconductor device of embodiments of the present invention can also be considered a nonplanar device because the electric field from the gate electrode 1120 and 1160 are applied from both horizontal (g2) and vertical sides (g1 and g3). The transistors 1110 and 1150 may include multiple bodies (e.g., 2, 3, 4) as described and illustrated herein in conjunction with the methods of forming germanium fins.

In one embodiment, a complementary metal oxide semiconductor (CMOS) integrated circuit includes a n-type metal oxide semiconductor (NMOS) device having a fin body with a first height and a p-type metal oxide semiconductor (PMOS) device having a germanium fin body with a second height and a corresponding silicon fin body having a third height. The germanium fin body forms a body of the PMOS device. The fin body of the NMOS device comprises a silicon body fin with the silicon fin body forming a body of a NMOS device. The germanium fin body has a pitch that is approximately one half of a pitch of the silicon fin of the PMOS device.

Figure 12:
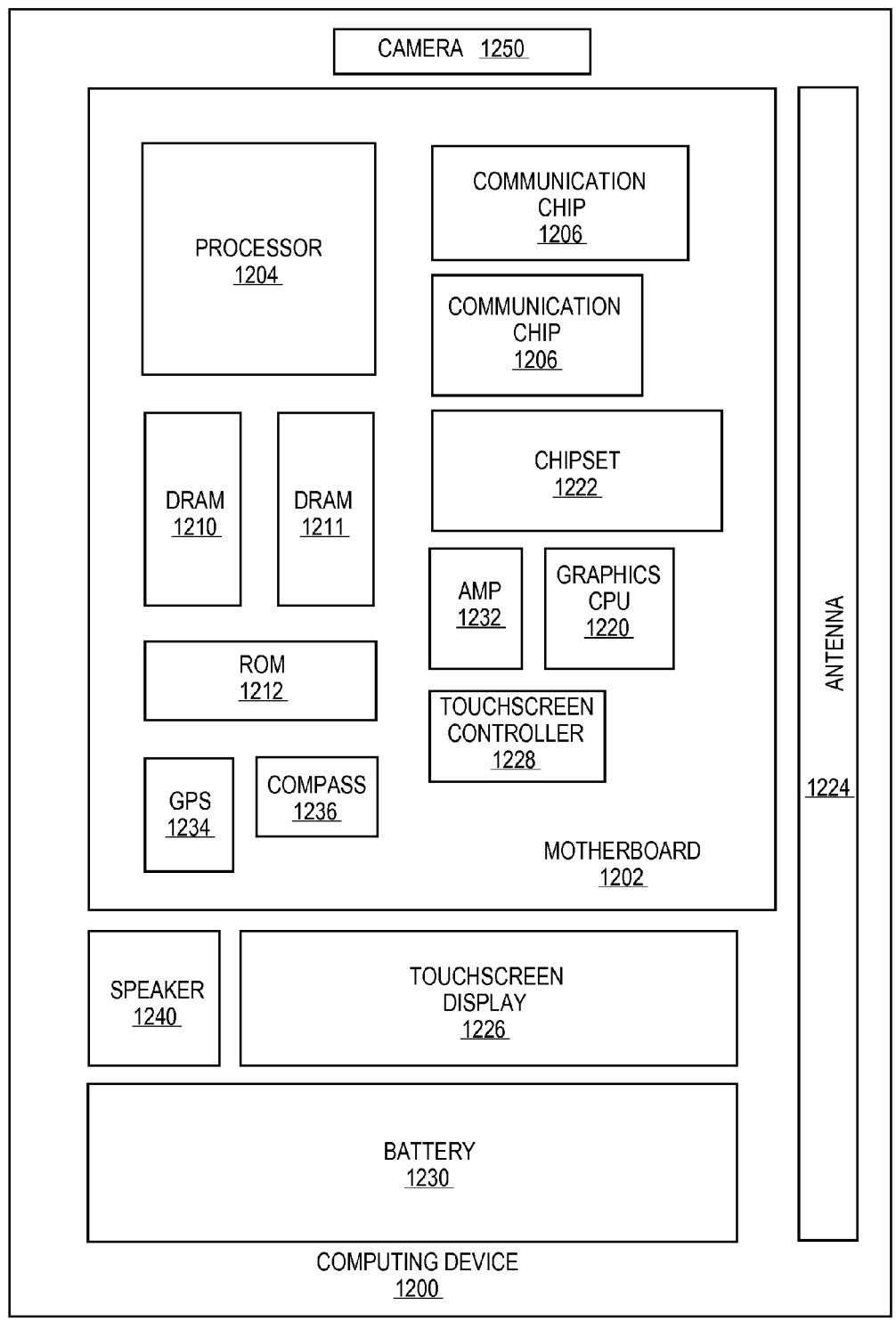
FIG. 12 illustrates a block diagram of a system 1400 in accordance with an embodiment of the invention.

FIG. 12 illustrates a computing device 1200 in accordance with one embodiment of the invention. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM 1210, 1211), non-volatile memory (e.g., ROM 1212), flash memory, a graphics processor 1220, a digital signal processor, a crypto processor, a chipset 1222, an antenna 1224, a display, a touchscreen display 1226, a touchscreen controller 1228, a battery 1230, an audio codec, a video codec, a power amplifier 1232, a global positioning system (GPS) device 1234, a compass 1236, an accelerometer, a gyroscope, a speaker 1240, a camera 1250, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. In some embodiments of the invention, the integrated circuit die of the processor includes one or more devices, such as transistors (e.g., PMOS, NMOS), that are formed in accordance with implementations of the invention. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. In accordance with another embodiment of the invention, the integrated circuit die of the communication chip includes one or more devices, such as transistors (e.g., PMOS, NMOS), that are formed in accordance with implementations of the invention.

In further embodiments, another component housed within the computing device 1200 may contain an integrated circuit die that includes one or more devices, such as transistors (e.g., PMOS, NMOS), that are formed in accordance with implementations of the invention.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

What is claimed is:

1. A method of fabricating a device, comprising:
   forming silicon fins on a substrate;
   forming a first dielectric layer on the substrate and adjacent to the silicon fins such that an upper region of the silicon fins are exposed;
   epitaxially growing a germanium layer on the upper region of the silicon fins;
   depositing a second dielectric layer on the substrate; and
   recessing the second dielectric layer to expose an upper surface of the silicon fins.

2. The method of claim 1, wherein forming the first dielectric layer on the substrate comprises:
   depositing the first dielectric layer on the substrate;
   recessing the first dielectric layer to expose the upper region of the silicon fins.

3. The method of claim 1, further comprising:
   selectively etching the exposed upper surface of the silicon fins to a recessed level below upper regions of the second dielectric layer and upper regions of the germanium layer.

4. The method of claim 1, further comprising:
   selectively etching the exposed upper surface of the silicon fins to a recessed level below upper regions of the second dielectric layer and upper regions of the germanium; and
   depositing a third dielectric layer on the substrate.

5. The method of claim 1, further comprising:
   selectively etching the exposed upper surface of the silicon fins to a recessed level below lower regions of the germanium layer; and
   depositing a third dielectric layer on the substrate.

6. A method of fabricating a device, comprising:
   forming silicon fins on a substrate;
   epitaxially growing a germanium or silicon germanium layer on the silicon fins;
   depositing a first dielectric layer on the germanium or silicon germanium layer;
   planarizing the first dielectric layer such that an upper surface of the silicon fins are exposed and an upper surface of the germanium or silicon germanium layer is exposed.

7. The method of claim 6, further comprising:
   selectively etching the exposed upper surface of the silicon fins to a recessed level below upper regions of the first dielectric layer and upper regions of the germanium or silicon germanium layer.

8. The method of claim 6, further comprising:
   depositing a second dielectric layer on the substrate.

9. The method of claim 6, wherein the germanium or silicon germanium layer comprises germanium fins or silicon germanium fins having a pitch that is approximately one half of a pitch of the silicon fins.

10. A method of fabricating a device, comprising:
    forming silicon fins on a substrate;
    forming a dielectric layer on the substrate and adjacent to the silicon fins such that an upper surface of the silicon fins are exposed;
    selectively etching the exposed upper surface of the silicon fins to a recessed level below upper regions of the dielectric layer;
    depositing a germanium layer on the exposed upper surface of the silicon fins; and
    annealing the germanium layer to form crystalline germanium fins.

11. The method of claim 10, further comprising:
    selectively epitaxially growing a layer on the exposed upper surface of the silicon fins.

12. The method of claim 11, further comprising:
    planarizing upper regions of the layer and the dielectric layer.

13. The method of claim 12, wherein the layer comprises germanium or silicon germanium.

14. A method of fabricating a device, comprising:
    forming silicon fins on a substrate;
    forming a first dielectric layer on the substrate and adjacent to the silicon fins such that an upper region including sidewalls and an upper surface of the silicon fins are exposed; and
    epitaxially growing a germanium layer on an exposed portion of the sidewalls and the upper surface of the upper region of the silicon fins.

15. The method of claim 14, wherein the silicon fins have a height of 30 to 50 nanometers.

16. The method of claim 14, wherein the silicon fins have a width of 5 to 10 nanometers.

17. The method of claim 14, wherein the silicon fins have a pitch of 50 to 100 nanometers between adjacent silicon fins.

* * * * *